(12) United States Patent
Ryu et al.

(10) Patent No.: US 6,533,892 B2
(45) Date of Patent: Mar. 18, 2003

(54) DEVICE FOR ETCHING THE BACKSIDE OF WAFER

(75) Inventors: Yung-Ho Ryu, Seoul (KR); Hyung-Hee Nam, Seoul (KR); Ho-Phil Jung, Suwon (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 22 days.

(21) Appl. No.: 09/921,403

(22) Filed: Aug. 2, 2001

(65) Prior Publication Data

US 2002/0166633 A1 Nov. 14, 2002

(30) Foreign Application Priority Data

May 9, 2001 (KR) .......................... 2001-25162

(51) Int. Cl.7 ............... B08B 3/00; B08B 7/04
(52) U.S. Cl. ................................ 156/345.11
(58) Field of Search ................ 438/689; 156/345.11; 134/116, 902

(56) References Cited

U.S. PATENT DOCUMENTS 5,279,316 A * 1/1994 Miranda .................. 134/102.1

* cited by examiner

Primary Examiner—Gregory Mills
Assistant Examiner—Sylvia R. MacArthur
(74) Attorney, Agent, or Firm—Renner, Otto, Boisselle & Sklar, LLP

(57) ABSTRACT

A device for etching the backside of a wafer is disclosed. The etching device directly feeds an etchant to a target wafer without using any medium, such as a conventional absorption fabric, thus uniformly etching the backside of the wafer, and prevents the wafer from coming into contact with the etchant during the removal of the wafer from the device, thus almost completely protecting the wafer from any damage. This etching device consists of a cylindrical housing having a conical bottom wall and an annular etching dam seated in the housing while forming an etchant collecting chamber and an etching bat An etchant supply unit is provided on the conical bottom wall of the housing. At least one first etchant discharging part communicates the etching bath with the collecting chamber, while at least one second etchant discharging part communicates the etchant collecting chamber with the outside. A target wafer is seated on the upper portion of the etching dam, and is etched at its backside by the etchant fed from the etchant supply unit into the etching bath The present invention also provides an etching system, having an etchant storage tank, a pump, and a flow controller, in addition to the etching device.

7 Claims, 12 Drawing Sheets

DEVICE FOR ETCHING THE BACKSIDE OF WAFER

BACKGROUND OF THE INVENTION

1. Field of the Invention

The present invention relates, in general, to a device for etching the backside of a wafer and, more particularly, to a device for chemically etching the backside of a thin wafer before a vapor-deposition process of depositing a metal layer on the backside of the wafer.

2. Description of the Prior Art

In a conventional process of producing semiconductor devices, such as diodes or transistors, the backside of a target wafer after a wafer fabrication process is initially ground until the wafer is thinned to a desired level. After the grinding process, the backside of the wafer is etched prior to being layered with a metal layer through a vapor-deposition process. The etching process for the backside of the wafer is to reduce the contact resistance between the wafer material, such as Si, and the metal of the layer formed on the backside of the wafer through the vapor-deposition process.

During such an etching process of chemically cutting the backside of the wafer, it is necessary to protect the metallizations arrayed on the front side of the wafer from any damage. In order to protect such metallizations during the etching process, an absorption fabric has been used in the prior art. The etching process using such an absorption fabric has been called "an etching process using an absorption fabric". In such an etching process using an absorption fabric, the absorption fabric is sufficiently drenched in an etchant before the absorption fabric comes into surface contact with only the backside of a target wafer so as to etch only the backside.

FIG. 1A is a perspective view of a conventional device for etching the backside of a wafer through an etching process using an absorption fabric. During an etching process using the device, an etchant is fed from an etchant supply source (not shown) into an etching bath 12, with an absorption fabric 14 immersed in the etchant to sufficiently absorb the etchant as shown in the drawing. Thereafter, a wafer 16 is laid on the absorption fabric 14 such that the backside of the wafer 16 is etched by the etchant of the fabric 14. After the backside of the wafer 16 is etched to a desired level, the wafer 16 is removed from the fabric 14, thus finishing the process of etching the backside of the wafer 16.

However, the conventional etching process using an absorption fabric is problematic in that the wafer may be easily damaged during the process. Such a problem of damaging the wafer is typically caused when the wafer 16 is removed from the absorption fabric 14 as shown in FIG. 1B. That is, the removal of the wafer 16 from the fabric 14 is carried out by using tweezers 18. However, when the wafer 16 is removed from the fabric 14 using the tweezers 18 as shown in FIG. 1B, surface tension caused by the etchant is generated at the junction "A" of the wafer 16 and the fabric 14. Due to the surface tension produced at the junction "A" during the removal of the wafer from the fabric 14, stress is applied to the wafer 16 in a direction opposite to the wafer separation force applying direction, thus easily damaging or breaking the wafer 16. In recent years, the wafers have been enlarged and reduced in their thickness to a level of no thicker than 200 $\mu$m, and so the thin wafers may be more easily damaged or broken during such a process of removing a wafer from an absorption fabric after an etching process.

When the backside of a target wafer is etched through the conventional etching process using an absorption fabric, the wafer may fail to come into uniform contact at its backside with the absorption fabric. In such a case, it is very difficult to uniformly etch the backside of the wafer. Reaction debris produced during the etching process is typically accumulated at a position around the backside of the wafer, and so it is almost impossible to accomplish the desired etching effect for the backside of the wafer.

In addition, it is very difficult to appropriately control the temperature of the etchant during the removal of the wafer from the absorption fabric since the fabric is sufficiently drenched with the etchant.

In a conventional process of etching the backside of a wafer using an absorption fabric, the etching effect is accomplished by the absorption fabric sufficiently drenched in the etchant. However, since the etching process is carried out by the absorption fabric coming into contact with the backside of the wafer, the wafer may be severely damaged due to the surface tension caused by the etchant when the wafer is removed from the absorption fabric. In addition, due to both the nonuniform contact between the wafer and the absorption fabric and the reaction debris typically accumulated at a position around the backside of the wafer during an etching process, it is almost impossible for the conventional etching process using the absorption fabric to accomplish uniform etching effect.

SUMMARY OF THE INVENTION

Accordingly, the present invention has been made keeping in mind the above problems occurring in the prior art and an object of the present invention is to provide a device for etching the backside of a wafer, which directly feeds an etchant to a target wafer without using any medium, such as a conventional absorption fabric, thus uniformly etching the backside of the wafer, and which prevents the wafer from coming into contact with the etchant during the removal of the wafer from the etching device, thus almost completely protecting the wafer from any damage.

Another object of the present invention is to provide a wafer etching system, which includes the above etching device designed to protect the wafer from any damage during an etching process, and which uniformly etches the backside of the wafer while easily controlling the temperature of the etchant as desired during the etching process.

In order to accomplish the above object, the present invention provides a device for etching the backside of a wafer, comprising: a cylindrical housing having a bottom wall, the bottom wall being conically shaped such that the bottom wall peaks at its center; an annular etching dam seated on the upper surface of the conical bottom wall of the housing, with an etchant collecting chamber defined between the sidewall of the dam and the sidewall of the housing, and an etching bath defined inside the dam for containing an etchant; an etchant supply unit provided on the conical bottom wall of the housing for feeding the etchant into the etching bath; and at least one first etchant discharging part formed at the junction of the etching dam and the housing, and allowing the etching bath to communicate with the etchant collecting chamber, and at least one second etchant discharging part formed on the lower portion of the sidewall of the housing, and allowing the etchant collecting chamber to communicate with the outside of the device, whereby the target wafer is seated on the upper portion of the etching dam, and is etched at its backside by the etchant fed from the etchant supply unit into the etching bath.

In an embodiment, a plurality of wafer support pieces are provided along the top edge of the etching dam for supporting the wafer, and allow the etchant from the etching bath to flow over the top edge of the dam to reach the etchant collecting chamber through a plurality of spaces defined between the wafer support pieces and the top edge of the dam.

In another embodiment, the etching dam is inclined at its top edge downward toward the etchant collecting chamber. In addition, at least one hole is formed at the upper portion of the sidewall of the dam, thus forming a third etchant discharging part communicating the etching bath with the etchant collecting chamber.

In the etching device, the etching dam consists of an annular body, formed by the sidewall integrated with inclined upper and lower walls, the upper wall extending from the top edge of the sidewall of the dam while being inclined downward in a direction toward the center of the dam, and the lower wall extending from the bottom edge of the sidewall while being inclined upward in a direction toward the center of the dam, with an inclination angle of the lower wall being the same as that of the conical bottom wall of the housing.

The present invention also provides an etching system, comprising: an etchant storage tank, a pump, and a flow controller, in addition to the above-mentioned etching device.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
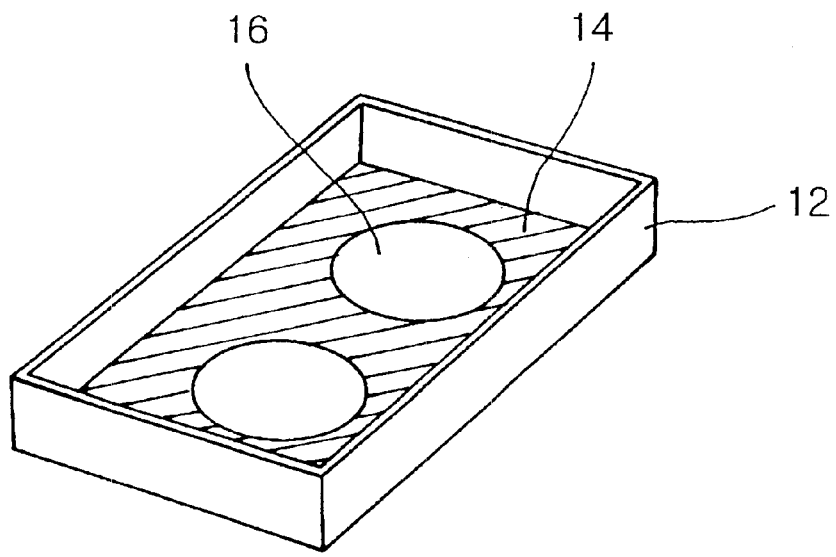
FIG. 1A is a perspective view of a conventional device for etching the backside of a wafer through an etching process using an absorption fabric.
Figure 1B:
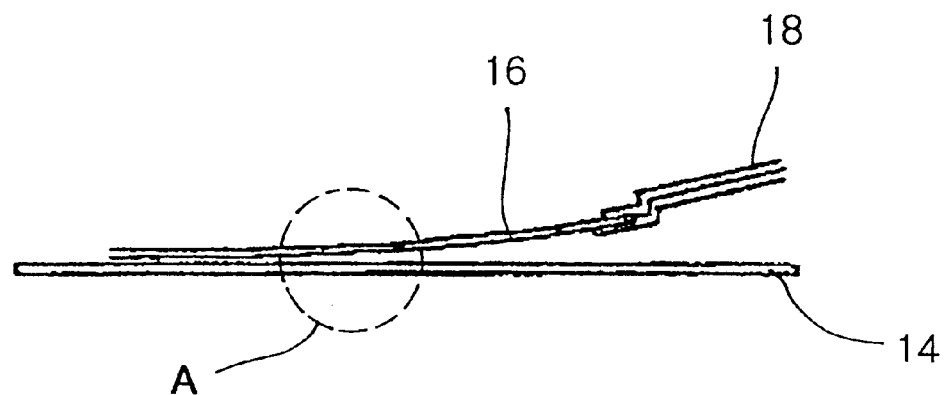
FIG. 1B is a sectional view, showing a process of separating the wafer from the absorption fabric in the conventional etching process using the device of FIG. 1A.

Reference now should be made to the drawings, in which the same reference numerals are used throughout the different drawings to designate the same or similar components.

Figure 2A:
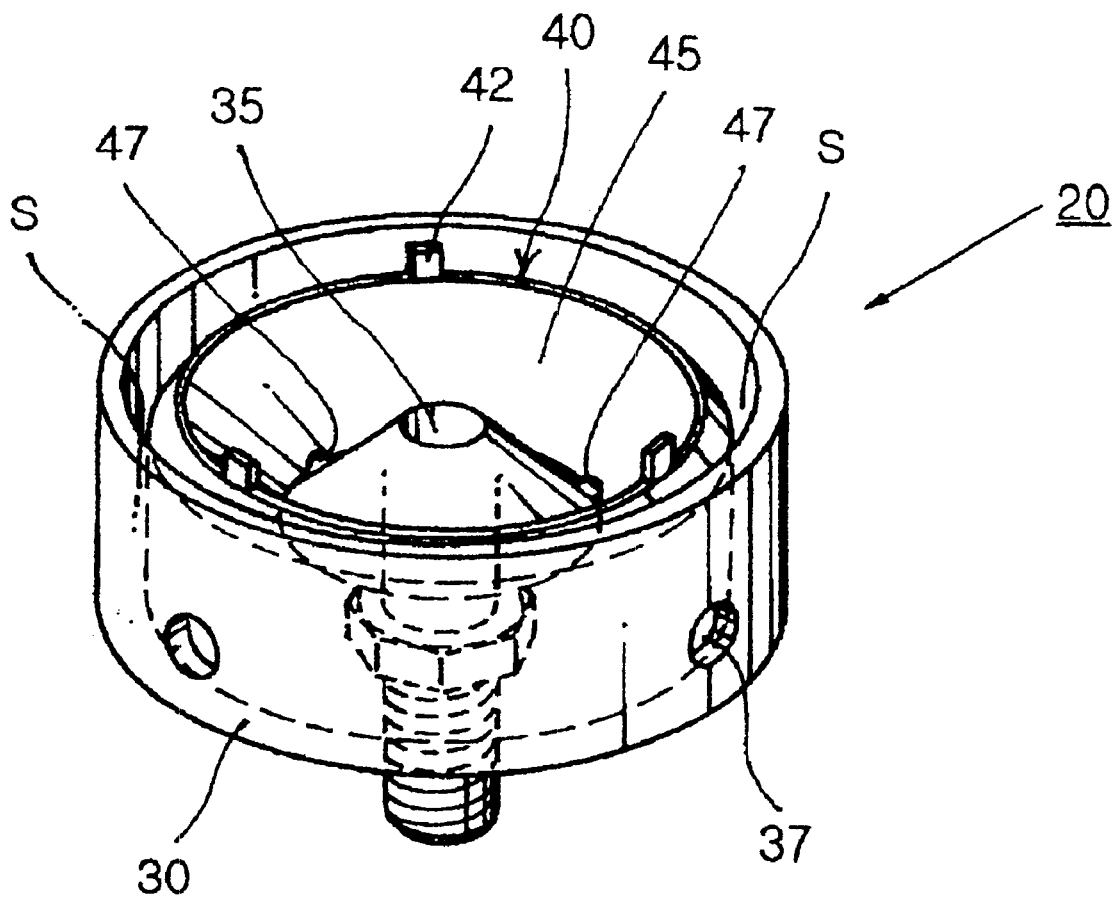
FIG. 2A is a perspective view of a device for etching the backside of a wafer in accordance with the preferred embodiment of the present invention.
Figure 2B:
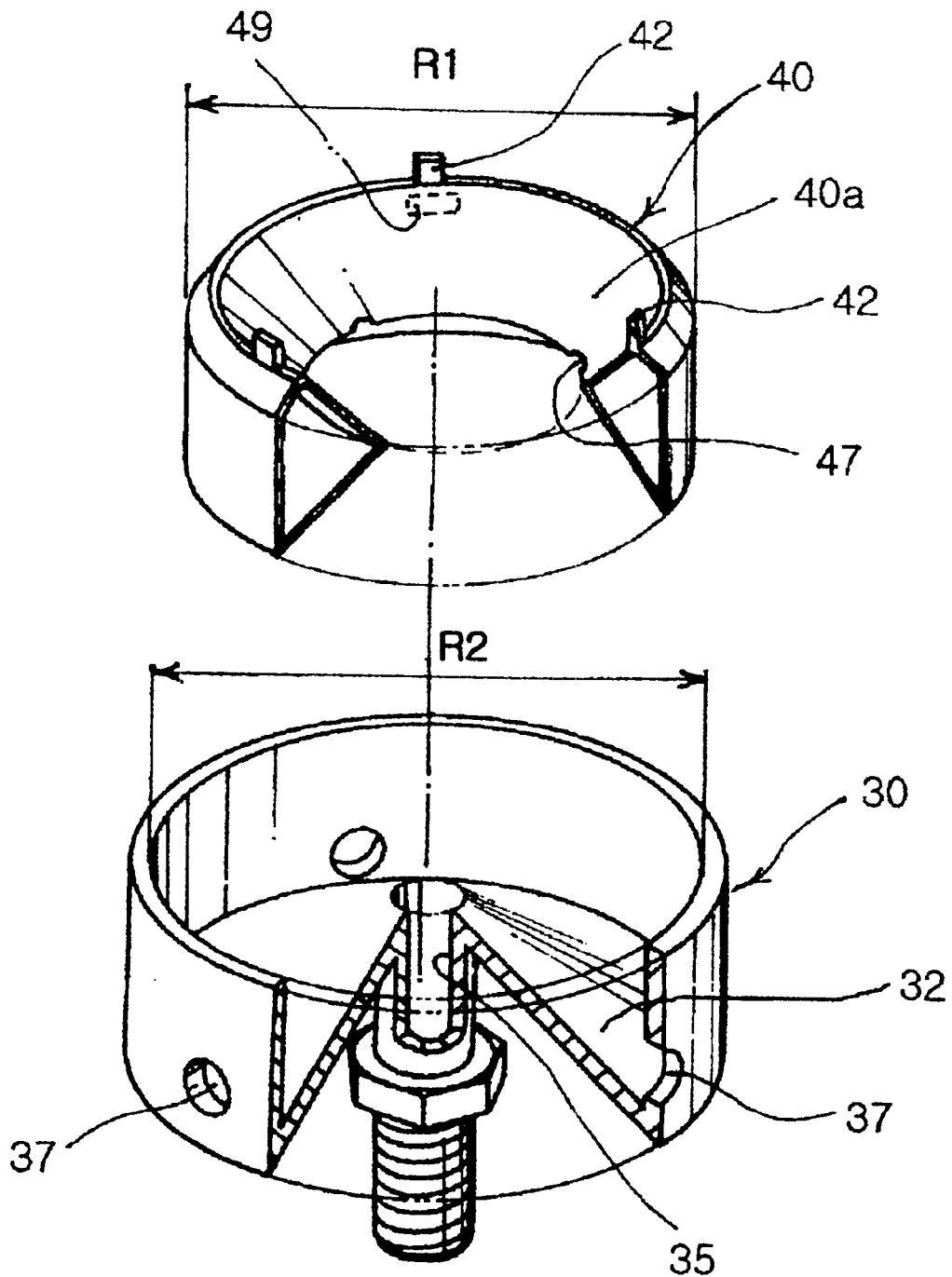
FIG. 2B shows the construction of a housing and an etching dam included in the etching device of FIG. 2A.
Figure 3A:
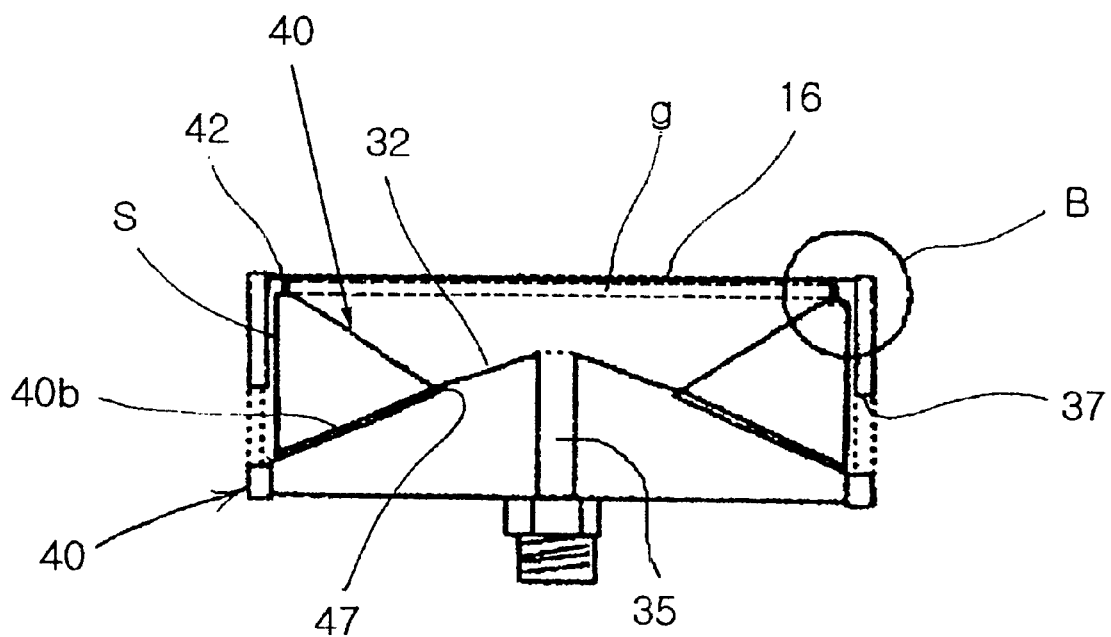
FIG. 3A is a side sectional view of the etching device of FIG. 2A.

FIG. 2A is a perspective view of a device for etching the backside of a target wafer in accordance with the preferred embodiment of the present invention. As shown in the drawing, the etching device 20 of the present invention comprises a cylindrical housing 30, of which the bottom wall 32 is conically shaped such that the conical wall 32 peaks at the center and has an etchant supply unit as will be described herein below. An annular etching dam 40 is seated on the upper surface of the conical bottom wall 32 of the housing 30. FIG. 2B shows the construction of the housing 30 and the etching dam 40 included in the etching device 20 of FIG. 2A. As shown in FIG. 2B, the annular etching dam 40 of this invention has a specifically designed shape so as to be closely seated on the upper surface of the conical bottom wall 32. That is, the etching dam 40 consists of a hollow annular body, formed by a cylindrical sidewall integrated with inclined upper and lower walls 40a and 40b. The upper wall 40a extends from the top edge of the sidewall while being inclined downward in a direction toward the center as shown in FIG. 2B. The lower wall 40b extends from the bottom edge of the sidewall while being inclined upward in a direction toward the center as shown in FIG. 3A. An annular rim is formed along the junction of the upper wall 40a and the sidewall of the etching dam 40. Three wafer support pieces 42 are provided along the rim of the etching dam 40 at regularly spaced intervals. In the etching dam 40, the inclination angle of the lower wall 40b is the same as that of the conical bottom wall 32 of the housing 30, and so the etching dam 40 is closely seated on the bottom wall 32 of the housing 30. Therefore, when the etching dam 40 is seated in the housing 30 as shown in FIG. 2A, the etching dam 40 forms an etching bath 45 in cooperation with the conical bottom wall 32 of the housing 30. In the etching device 20 of this invention, the outer diameter R1 of the annular etching dam 40 is slightly smaller than the inner diameter R2 of the housing 30 leaving a predetermined annular gap "S" between the outer surface of the etching dam's sidewall and the inner surface of the housing's sidewall. The annular gap "S" forms an etchant collecting chamber. In the etching device 20, the etchant collecting chamber "S" collects the etchant prior to draining the etchant from the device 20 to the outside.

The etching device 20 also has an etchant supply unit 35, which is provided at the center of the conical bottom wall 32 of the housing 30 for feeding an etchant into the etching bath 45. At least one first etchant discharging part 47 is formed at the junction of the etching dam 40 and the conical bottom wall 32 of the housing 30, and allows the etching bath 45 to communicate with the etchant collecting chamber "S", thus discharging the etchant from the etching bath 45 to the etchant collecting chamber "S". In addition, at least one second etchant discharging part 37 is formed on the lower portion of the sidewall of the housing 30, and allows the etchant collecting chamber "S" to communicate with the outside of the device 20, thus discharging the etchant from the etchant collecting chamber "S" to the outside. In the present invention, the number of each of the etchant discharging parts 37 and 47 may be controlled as desired. In the preferred embodiment of the drawings, the first etchant discharging part 47 is preferably formed by at least one groove extending from the inside edge to the lower edge of the etching dam 40 in a radial direction. However, the first etchant discharging part 47 may be formed by at least one radial groove, which is formed on the upper surface of the conical bottom wall 32 of the housing 30 so as to communicate the etching bath 45 to the etchant collecting chamber "S".

In accordance with another embodiment of this invention, the etching device may have a third etchant discharging part 49, consisting of a plurality of holes formed at the upper portion of the sidewall of the etching dam 40 to communicate the etching bath 45 with the etchant collecting chamber "S", without forming any wafer support piece 42 on the top rim of the etching dam 40. In such a case, a target wafer 16 is laid on the etching dam 40 during an etching process. The holes of the third etchant discharging part 49 discharge the etchant from the etching bath 45 to the etchant collecting chamber "S" in the same manner as that expected from the spaces defined between the wafer, the top rim and the opposite side edges of the wafer support pieces 42.

The operational effect of the etching device 20 according to the present invention will be described herein below. In order to etch the backside of a wafer using the device 20, a target wafer is laid on the wafer support pieces 42 of the etching dam 40 such that the backside of the wafer is directed toward the etching bath 45. Thereafter, an etchant is fed into the etching bath 45 from the etchant supply unit 35. During the etchant feeding process, a part of etchant is discharged from the etching bath 45 to the etchant collecting chamber "S" through the first etchant discharging part 47. Therefore, it is necessary to compensate for the quantity of the discharged etchant during the etching process. In order to accomplish this, the quantity of supplied etchant has to be determined such that the etchant fills the etching bath 45 while compensating for the discharged etchant. When the etchant fills the etching bath 45 to reach the top rim of the etching dam 40, the surplus etchant formed by the continuous feeding of the etchant starts to etch the backside of the wafer while flowing over the top rim of the dam 40 through the spaces defined between the wafer 16, the top rim and the opposite side edges of the wafer support pieces 42, and reaching the etchant collecting chamber "S". Therefore, the backside of the wafer 16 is directly etched without being brought into contact with other material except for the etchant. In addition, the etchant during the etching process flows upward in a vertical direction from the etchant supply unit 35 provided at the center of the conical bottom wall 32 of the housing 30 to reach the center of the wafer's backside. Thereafter, the etchant uniformly flows outward from the center of the wafer's backside in a radial direction. During the etching process, the processed etchant along with the reaction debris is discharged from the etching bath 45 to the etchant collecting chamber "S" through the spaces defined between the wafer, the top rim and the opposite side edges of the wafer support pieces 42. In such a case, new etchant is continuously fed from the etchant supply unit 35 into the etching bath 45 to fill the bath 45. It is thus possible to improve the etching efficiency, in addition to accomplishing uniform etching effect during the etching process. When the backside of the wafer 16 is completely etched to a desired level, the etchant supplying is stopped prior to draining the etchant from the etching bath 45 to the etchant collecting chamber "S" trough the first etchant discharging part 47. The etchant is, thereafter, drained from the etchant collecting chamber "S" to the outside through the second etchant discharging part 37. Since the etchant is drained from the etching bath 45 to the etchant collecting chamber "S" after the etching process as described above, surface tension caused by the etchant is not produced at the wafer when the wafer is removed from the device 20. Therefore, the etching device 20 of this invention does not damage or break the wafers during the removal of the wafer from the device after the etching process, different from the conventional etching device using an absorption fabric.

Figure 3B:
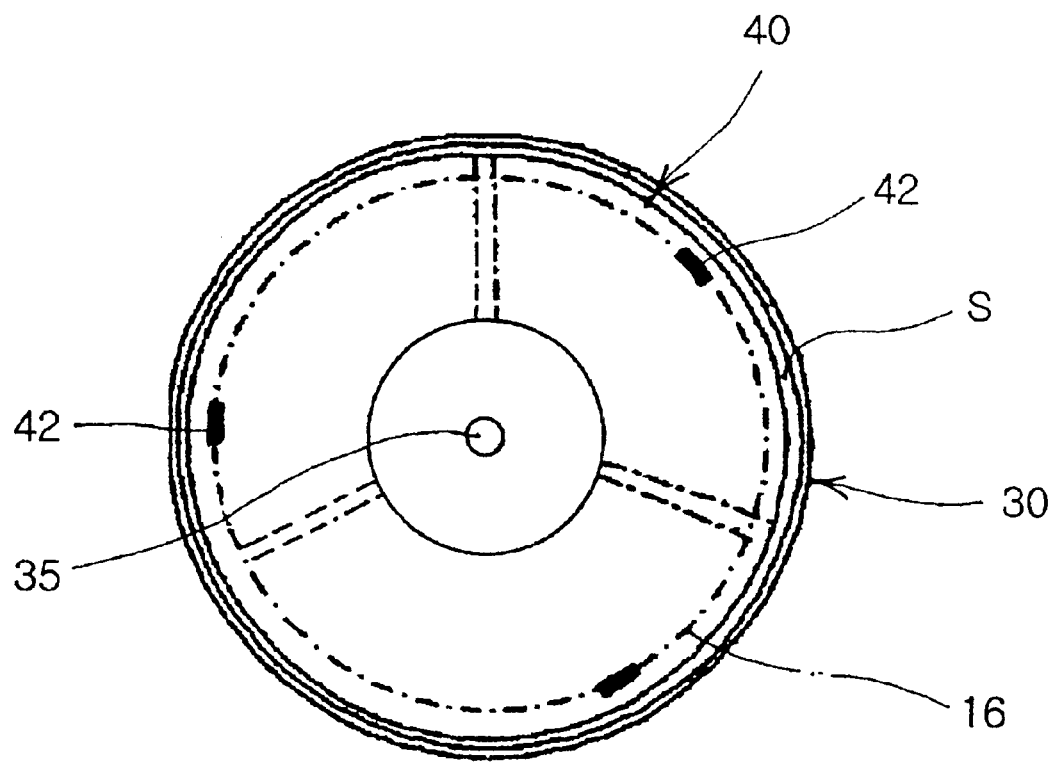
FIG. 3B is a plan view of the etching device of FIG. 2A.

The etching device of this invention will be described in more detail herein below with reference to FIGS. 3A and 3B. FIG. 3A is a side sectional view of the etching device of FIG. 2A. FIG. 3B is a plan view of the etching device. As shown in FIG. 3A, the etching device 20 of this invention consists of the cylindrical housing 30, with the etching dam 40 seated in the housing 30. In the etching device 20, the outer diameter of the etching dam 40 is slightly smaller than the inner diameter of the housing 30 leaving the annular etchant collecting chamber "S" between the outer surface of the etching dam's sidewall and the inner surface of the housing's sidewall. The etchant collecting chamber "S" collects the etchant prior to draining the etchant from the device 20 to the outside. As shown in FIG. 3B, the first etchant discharging part 47 is formed at the junction of the lower wall 40b of the etching dam 40 and the conical bottom wall 32 of the housing 30, and discharges the etchant from the etching bath 45 to the etchant collecting chamber "S". During an etching process, a target wafer 16 is laid on the wafer support pieces 42 of the etching dam 40, with the sidewall of the housing 30 surrounding the outer edge of the wafer 16. In the preferred embodiment the number of each of the wafer support pieces 42 and the first etchant parts 47 is set to three. However, it should be understood that the number of each of the wafer support pieces 42 and the first etchant parts 47 may be changed as desired without being limited.

In FIG. 3A, the reference character "G" denotes a gap between the etchant level within the etching bath 45 and the backside of the wafer 16. In the present invention, it is preferred to set the gap "G" to a minimum size such that the etchant within the bath 45 comes into contact with the backside of the wafer 16 due to its surface tension. Therefore, it is necessary to appropriately set the height of the wafer support pieces 42 while considering surface tension of a selected etchant.

Figure 3C:
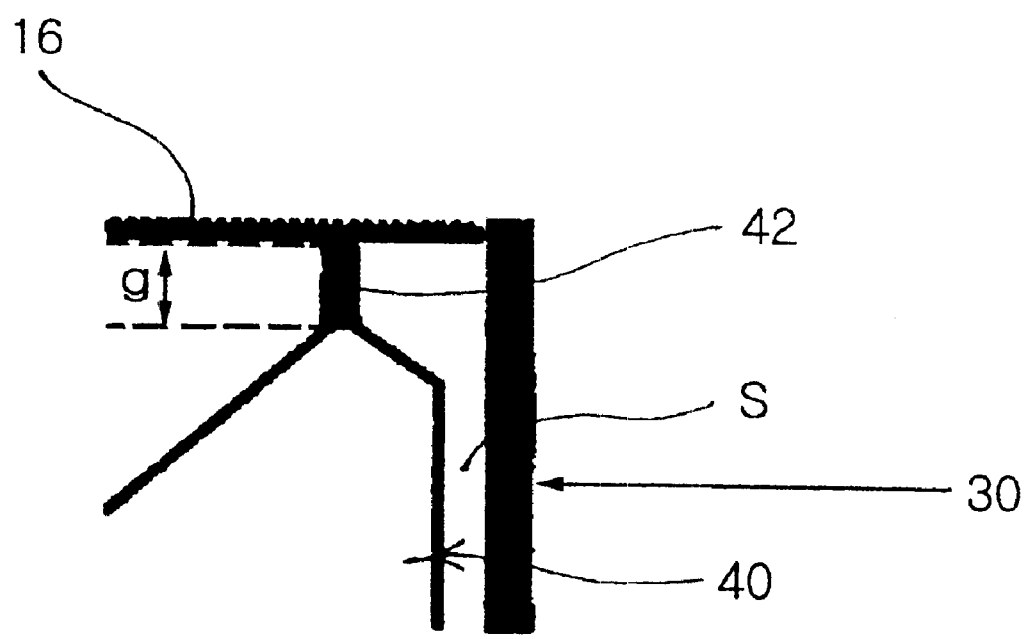
FIG. 3C is a view, schematically showing the structure of the top portion "B" of the etching device of FIG. 3A.

FIG. 3C is a view, schematically showing the structure of the top portion "B" of the etching device 20 of this invention. As shown in the drawing, the wafer 16 is laid on the wafer support pieces 42 of the etching dam 40, with the sidewall of the housing 30 surrounding the outer edge of the wafer 16. therefore, the wafer 16 is stably positioned on the etching device 20 during the etching process.

In the etching device 20 of this invention, the rim's outer edge of the etching dam 40 outside the wafer support pieces 42 is inclined downward toward the etchant collecting chamber "S" as best seen in FIG. 3C. Therefore, surface tension of the etchant is preferably reduced when the etchant from the bath 45 flows over the top rim of the dam 40 to reach the collecting chamber "S". It is thus possible to prevent the etchant from undesirably flowing to the front side of the wafer 16 when it flows over the top Tim. The inclined outer edge of the dam's rim also allows tweezers to easily approach the wafer's edge when it is desired to remove the wafer 16 from the device 20 using the tweezers after the etching process.

Figure 4:
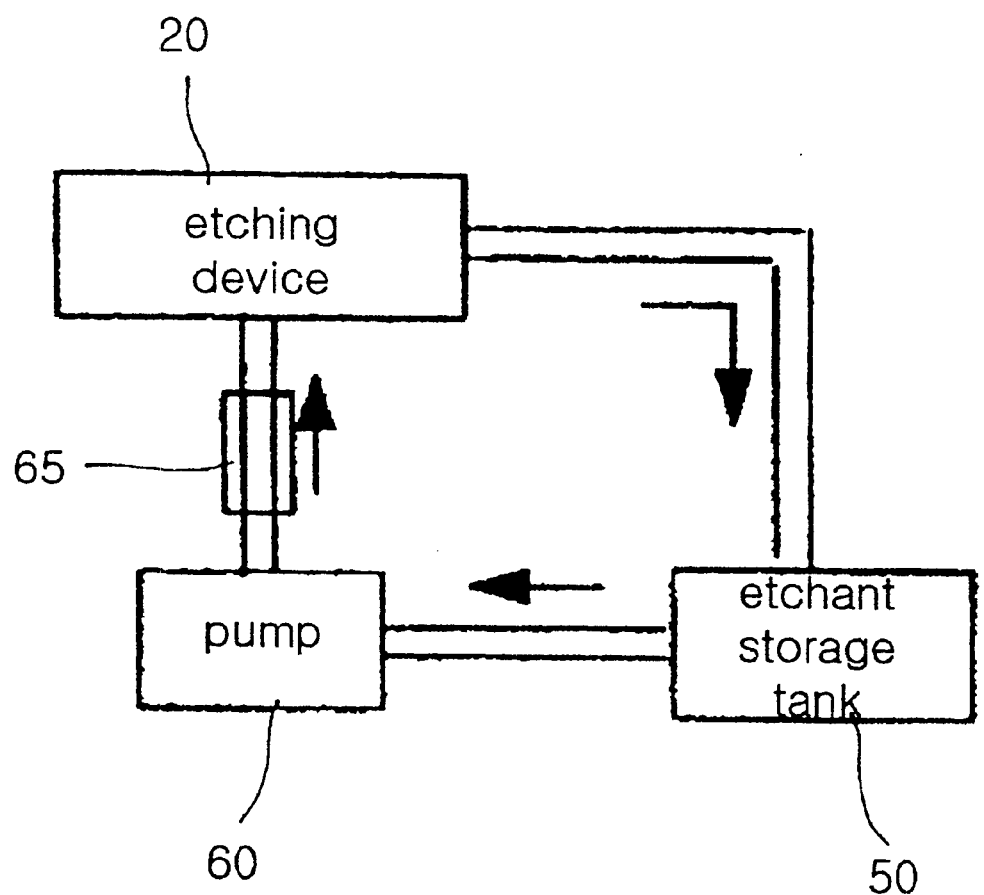
FIG. 4 is a block diagram, showing the construction of an etching system including the etching device of FIG. 2A.

FIG. 4 is a block diagram, showing the construction of an etching system including the etching device 20 of this invention.

As shown in the drawing, the etching system comprises an etchant storage tank 50, a pump 60 and a flow controller 65, in addition to the etching device 20 of this invention. During an operation of the etching system, the pump 60 pumps up the etchant from the tank 50 to feed the etchant into the etching device 20. In such a case, the flow controller 65 controls the flow rate of the supplied etchant such that the quantity of the supplied etchant from the tank 50 is larger than that of the discharged etchant drained from the etching bath of the device 20 to the etchant collecting chamber through the first etchant discharging part 47. When the backside of a target wafer is completely etched to a desired level, the pump 60 is turned off to stop the etchant supplying for the device 20. During the etching process, the etchant from the collecting chamber of the device 20 is returned to the tank 50 through the second etchant discharging part of the device 20. In such a case, the etchant storage tank 50 mixes the new etchant having a low temperature with the returned etchant having a high temperature due to the chemical etching process, thus maintaining the temperature of the stored etchant at an appropriate point. Since the system supplies the etchant having an appropriate temperature to the etching device 20 during an etching process, it is possible to improve the etching efficiency.

FIGS. 5A to 5E are views, showing the etching process using the etching device 20 of this invention, with the flow of the etchant within the device 20 at each step shown by arrows. In the drawings, the discharged etchant flows in directions as shown by the thick arrows "f1" while the etchant used for etching flows in directions as shown by the thin arrows "f2".

Figure 5A:
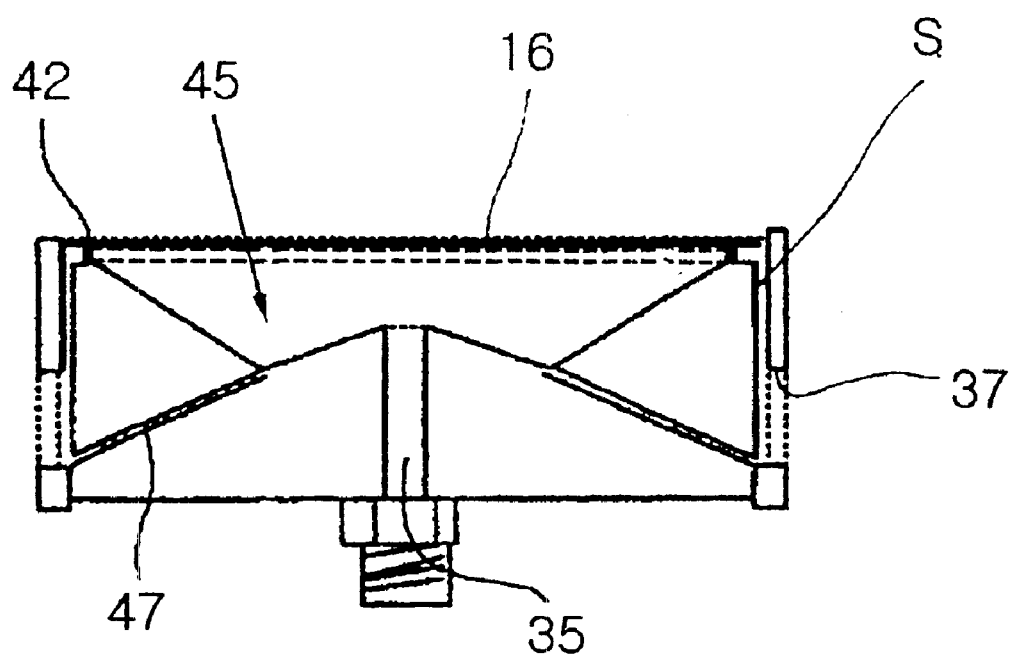
FIGS. 5A to 5E are views, showing the process of etching the backside of a wafer using the etching device of FIG. 2A.
Figure 5B:
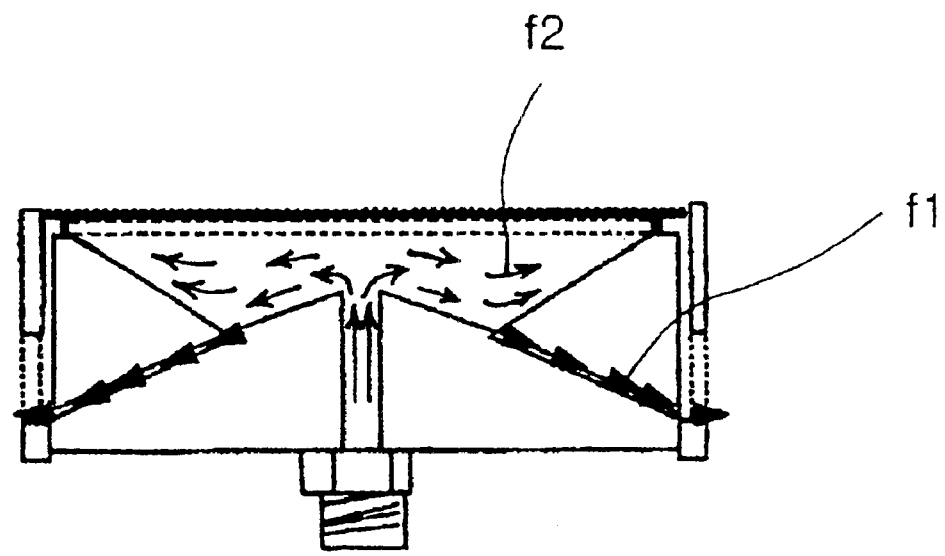
Figure 5B:
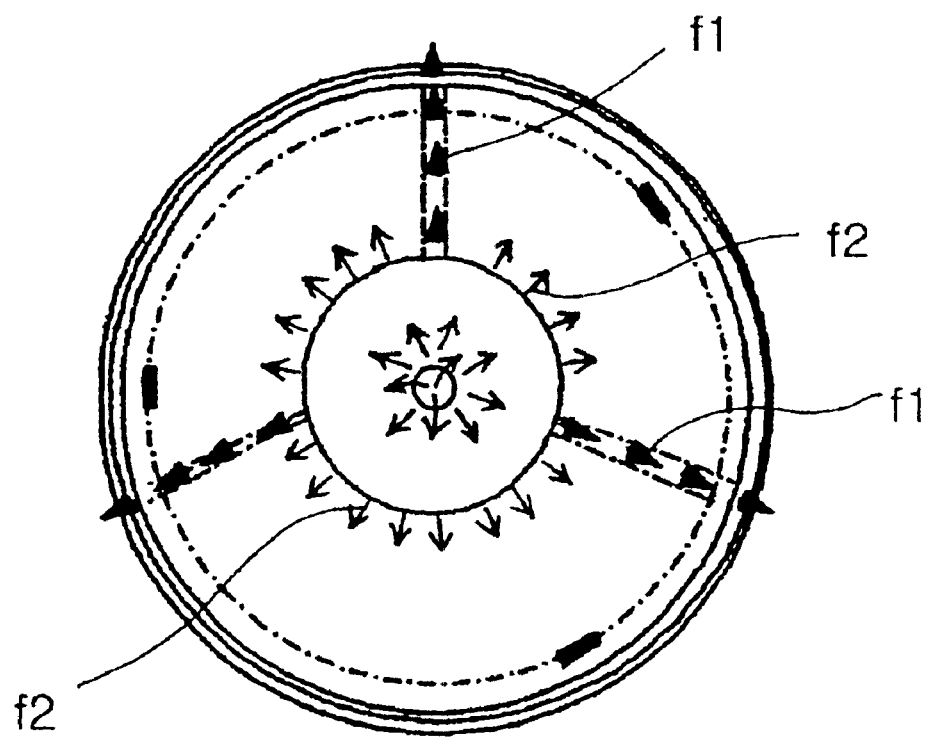
Figure 5C:
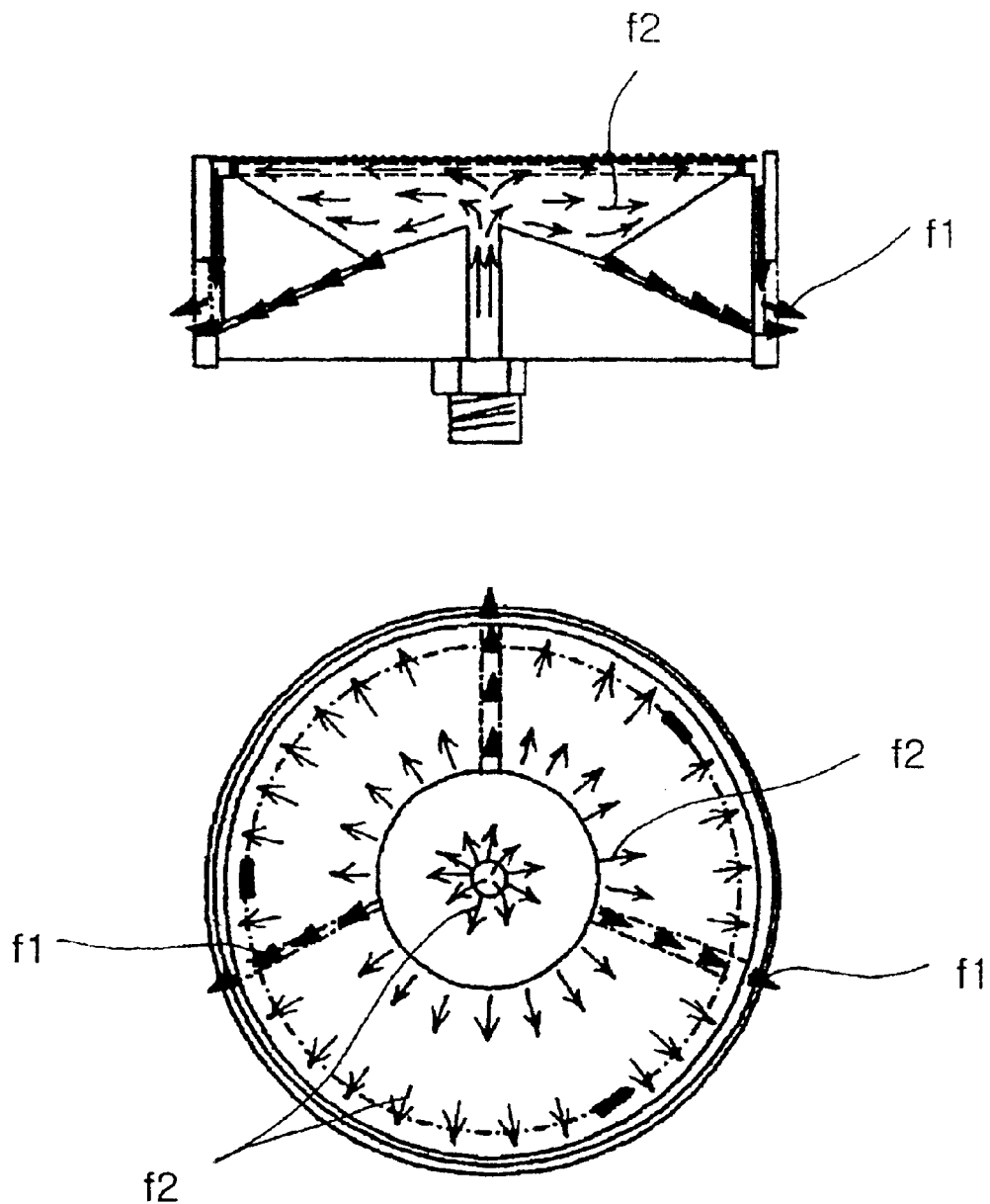
Figure 5D:
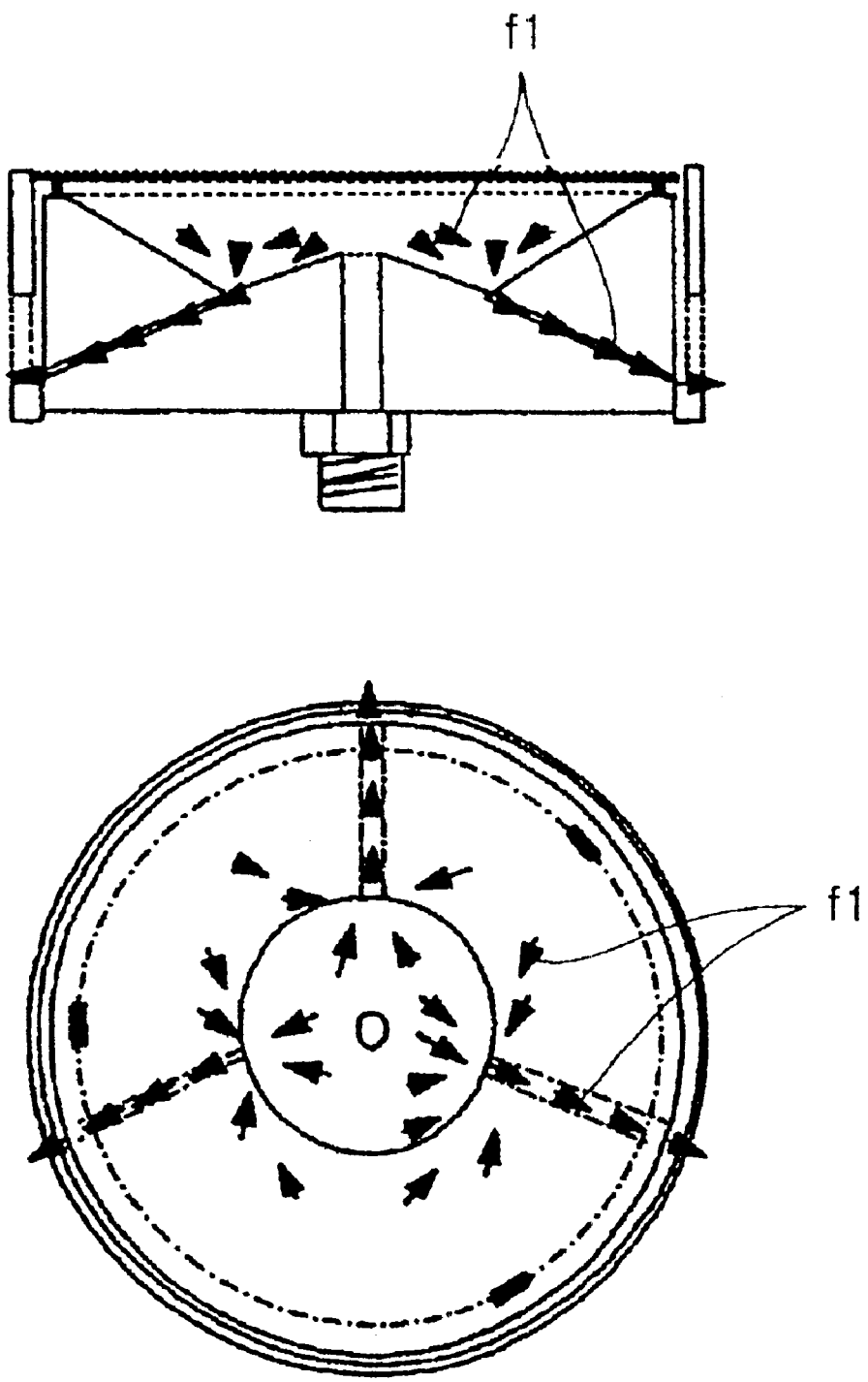
Figure 5E:
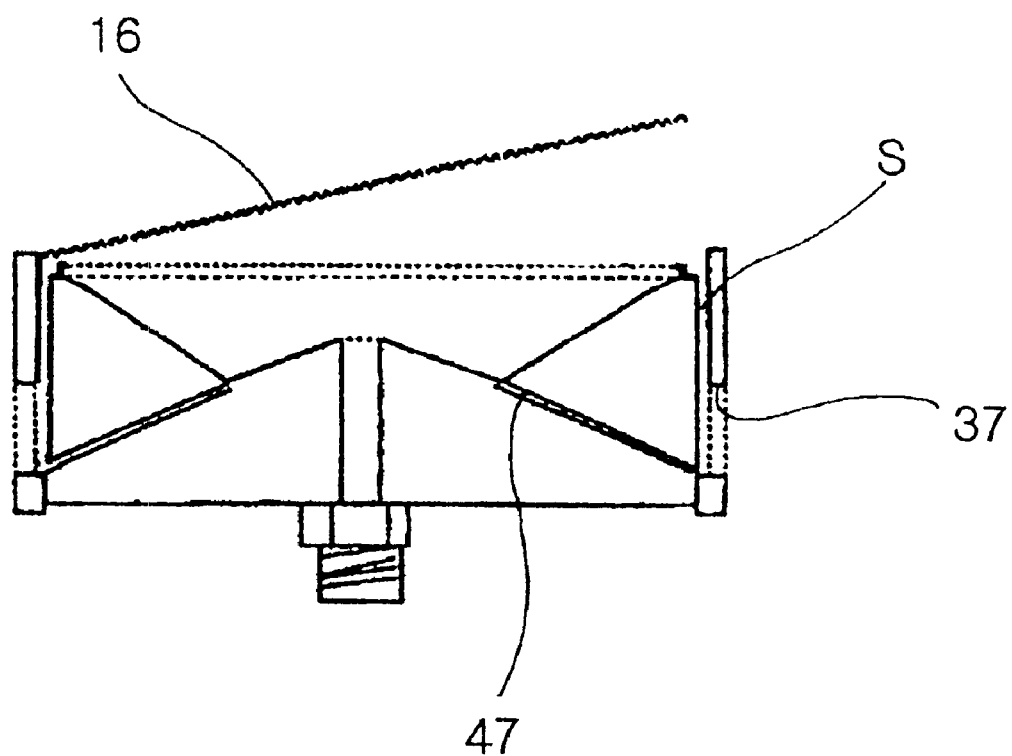

As shown in FIG. 5A, a target wafer 16 is laid on the wafer support pieces 42 of the etching dam 40 such that the backside of the wafer 16 is directed toward the etching bath 45. Thereafter, an etchant is fed into the etching bath 45 from the etchant supply unit 35. During the etchant feeding process, a part of etchant is discharged from the etching bath 45 to the etchant collecting chamber "S" through the first etchant discharging part 47 as shown in FIG. 5B. However, since the quantity of supplied etchant is larger than that of the discharged etchant, the etchant fills the etching bath 45 while compensating for the discharged etchant. When the etchant fills the etching bath 45 to reach the top rim of the etching dam 40, the etchant starts to etch the backside of the wafer 16 while flowing from the center of the bath 45 outward in a radial direction as shown in FIG. 5C. The etchant also flows over the top rim of the dam 40 through the spaces defined between the wafer 16, the top rim and the opposite side edges of the wafer support pieces 42, and reaches the etchant collecting chamber "S". When the backside of the wafer 16 is etched to a desired level, the etchant supplying is stopped prior to draining the etchant from the etching bath 45 to the etchant collecting chamber "S" through the first etchant discharging part 47 as shown in FIG. 5D. The etchant is, thereafter, drained from the etchant collecting chamber "S" to the tank 50 through the second etchant discharging part 37. Since the etchant is drained from the etching bath 45 to the tank 50 after the etching process as described above, the wafer 16 does not come into contact with any etchant during the removal of the wafer from the device 20 as shown in FIG. 5E. Therefore, surface tension caused by the etchant is not produced at the wafer 16 during the removal of the wafer 16 from the device 20, and so the wafer 16 is not damaged or broken.

As described above, the present invention provides a device for etching the backside of a wafer. This etching device directly feeds an etchant to a target wafer without using any medium, such as a conventional absorption fabric, thus uniformly etching the backside of the wafer. This device also prevents the wafer from coming into contact with the etchant during the removal of the wafer from the device, thus almost completely protecting the wafer from any damage. The present invention also provides a wafer etching system, which includes the etching device designed to protect a target wafer from any damage during an etching process. The system also uniformly etches the backside of the wafer while easily controlling the temperature of the etchant as desired during the etching process.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A device for etching a backside of a wafer, comprising:
 a cylindrical housing having a bottom wall, said bottom wall being conically shaped such that the bottom wall peaks at its center;
 an annular etching dam seated on an upper surface of the conical bottom wall of said housing, with an etchant collecting chamber defined between a sidewall of said dam and a sidewall of said housing, and an etching bath defined inside the dam for containing an etchant;
 an etchant supply unit provided on the conical bottom wall of said housing for feeding the etchant into said etching bath;
 at least one first etchant discharging part formed at a junction of the etching dam and the housing, and allowing the etching bath to communicate with the etchant collecting chamber; and
 at least one second etchant discharging part formed on a lower portion of the sidewall of said housing, and allowing the etchant collecting chamber to communicate with the outside of the device,
 whereby the target wafer is seated on an upper portion of the etching dam, and is etched at its backside by the etchant fed from the etchant supply unit into the etching bath.

2. The device according to claim 1, wherein a plurality of wafer support pieces are provided along a top edge of said etching dam for supporting the wafer, and allow the etchant from the etching bath to flow over the top edge of the dam to reach the etchant collecting chamber through a plurality of spaces defined between the wafer support pieces and the top edge of the dam.

3. The device according to claim 1, wherein said etching dam is inclined at its top edge downward toward the etchant collecting chamber.

4. The device according to claim 1, wherein at least one hole is formed at an upper portion of the sidewall of the etching dam, thus forming a third etchant discharging part communicating the etching bath with the etchant collecting chamber.

5. The device according to claim 1, wherein the etching dam consists of an annular body, formed by the sidewall integrated with inclined upper and lower walls, said upper wall extending from a top edge of said sidewall of the dam while being inclined downward in a direction toward the center of the dam, and said lower wall extending from a bottom edge of the sidewall while being inclined upward in a direction toward the center of the dam, with an inclination angle of the lower wall being the same as that of the conical bottom wall of said housing.

6. The device according to claim 1, wherein said first etchant discharging part is formed by at least one groove extending from an inside edge to a lower edge of the etching dam in a radial direction.

7. An etching system, comprising:
 an etchant storage tank;
 an etching device, consisting of: a cylindrical housing having a bottom wall, said bottom wall being conically shaped such that the bottom wall peaks at its center, an annular etching dam seated on an upper surface of the conical bottom wall of said housing, with an etchant collecting chamber defined between a sidewall of said dam and a sidewall of said housing, and an etching bath defined inside the dam for containing an etchant; an etchant supply unit provided on the conical bottom wall of said housing for feeding the etchant into said etching bath; and at least one first etchant discharging part formed at a junction of the etching dam and the housing, and allowing the etching bath to communicate with the etchant collecting chamber, and at least one second etchant discharging part formed on a lower portion of the sidewall of said housing, and allowing the etchant collecting chamber to communicate with the outside of the device, whereby a target wafer is seated on an upper portion of the etching dam, and is etched at its backside by the etchant fed from the etchant supply unit into the etching bath;

a pump used for pumping up the etchant from said storage tank to feed the etchant into the etching device through the etchant supply unit of the etching device; and a flow controller controlling a flow rate of the etchant fed to said etching bath by the pump.

\* \* \* \* \*